United States Patent [19]

Mishiro et al.

[11] 4,275,363
[45] Jun. 23, 1981

[54] METHOD OF AND APPARATUS FOR DRIVING AN ULTRASONIC TRANSDUCER INCLUDING A PHASE LOCKED LOOP AND A SWEEP CIRCUIT

[75] Inventors: Shoji Mishiro; Seiji Hamada, both of Kawasaki, Japan

[73] Assignee: Taga Electric Co., Ltd., Tokyo, Japan

[21] Appl. No.: 65,162

[22] Filed: Aug. 9, 1979

[30] Foreign Application Priority Data

Jul. 6, 1979 [JP] Japan .................................. 54-85033

[51] Int. Cl.³ ....................... H01L 41/08; H03L 7/12; H03B 5/32
[52] U.S. Cl. ........................................ 331/4; 310/316; 318/116; 331/116 R
[58] Field of Search ............... 331/4, 116 R; 310/316, 310/26; 318/116

[56] References Cited

U.S. PATENT DOCUMENTS

| 2,752,512 | 6/1956 | Sarratt . | |
|---|---|---|---|
| 2,917,691 | 12/1959 | DePrisco et al. . | |
| 3,889,166 | 6/1975 | Scurlock | 318/116 |
| 3,931,533 | 1/1976 | Raso et al. | 318/116 X |
| 3,967,143 | 6/1976 | Watanabe et al. | 318/116 X |
| 3,975,650 | 8/1976 | Payne | 318/116 X |
| 4,175,242 | 11/1979 | Kleinschmidt | 310/316 |

Primary Examiner—Siegfried H. Grimm
Assistant Examiner—Edward P. Westin
Attorney, Agent, or Firm—Oblon, Fisher, Spivak, McClelland & Maier

[57] ABSTRACT

A method and a circuit for stably driving an ultrasonic transducer by sweeping, as a first step of starting the oscillation, the oscillating frequency over a range wider than a PLL followable range, finding a resonant point to lock the oscillating frequency thereto, and effecting, as a second step, the PLL following operation starting from the above resonant point.

5 Claims, 3 Drawing Figures

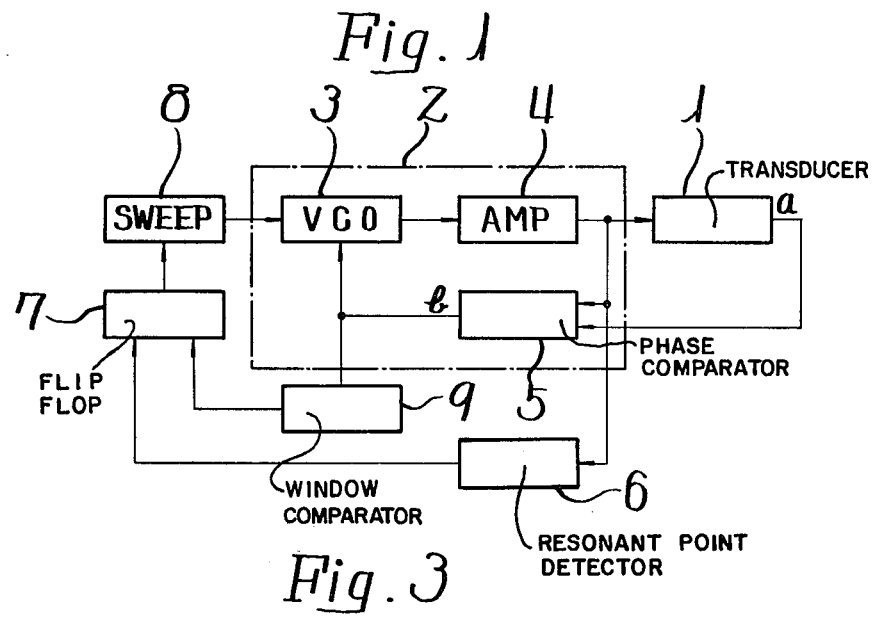
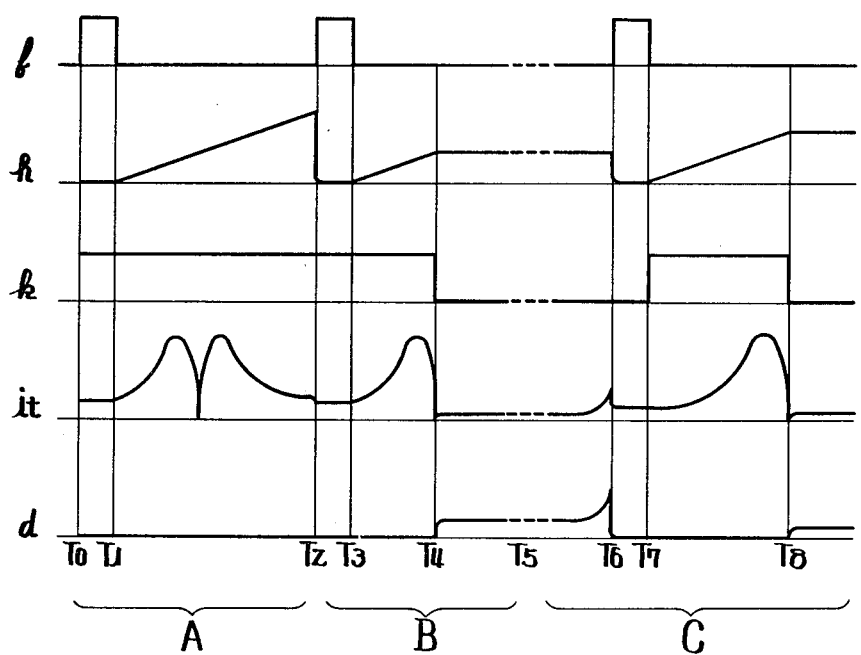

METHOD OF AND APPARATUS FOR DRIVING AN ULTRASONIC TRANSDUCER INCLUDING A PHASE LOCKED LOOP AND A SWEEP CIRCUIT

DESCRIPTION OF THE INVENTION

The present invention relates to an ultrasonic wave generating apparatus with a sweep locked PLL, and particularly to a method of driving an ultrasonic transducer and a circuit therefor.

In general, ultrasonic transducers employed for ultrasonic appliances should be operated at their resonant frequencies so that their electro-mechanical conversion efficiencies can be enhanced. The mechanical characteristics of resonance, however, exhibit sharp Q values, Particularly, the Q values appear when the amplitude of vibration is amplified using a horn. Moreover, the resonant frequencies vary in accordance with external conditions such as the temperature at which the ultrasonic transducer is used, driving level or loading level. Therefore, a motional feedback oscillator has been extensively employed, in which the oscillating frequency of a driving circuit changes while following the changes in resonant frequency of the ultrasonic transducer.

Furthermore, there has recently been employed a PLL follower circuit having a voltage controlled oscillator which is controlled by the output of a phase comparator which detects a shifted value from a predetermined phase difference between a driving voltage or a driving current of the ultrasonic transducer and a vibratory velocity signal, and in which the ultrasonic transducer is driven by the oscillating frequency of the voltage controlled oscillator so that the oscillating frequency is varied while following the resonant frequency of the ultrasonic transducer.

However, a serious problem is presented when such a PLL follower circuit is used, i.e., when the phase locked loop is employed. In many ultrasonic appliances such as plastic welders and machine tools, the resonant frequency varies depending upon the horns and tools of various types and the degree of wear of the tools. If the change is too great, the followable range of the phase locked loop is exceeded causing the apparatus to be inoperative. Therefore, the horns and tools must be manufactured with high precision in regard to the resonant frequencies, and in addition, strict limits must be imposed on the degree of wear of the horns and tools. If an attempt is made to broadly set the following range, there develops such serious trouble that abnormal operation takes place due to the range of operating frequency of a vibratory velocity detector of the ultrasonic transducer being narrow. This is because, if the driving frequency greatly deviates from the resonant frequency of the ultrasonic transducer, the intensity of the vibratory velocity signals is markedly reduced to fall outside the detectable range of the phase comparator, whereby the phase comparator operates improperly. Hence, according to the conventional apparatus employing the phase locked loop, the followable range has been set within a range that satisfies the abovementioned function, and the replaceable horns and tools have been with high precision manufactured to satisfy these requirements.

The first object of the present invention is to provide a method which is capable of reliably following the resonant frequency of an ultrasonic transducer by way of the phase locked loop without causing erroneous operation.

The second object of the present invention is to provide a method which is capable of preventing erroneous operation such as locking at subresonant points.

The third object of the present invention is to provide a method which automatically finds a new resonant point to lock the oscillating frequency thereto even when the resonant frequency is so greatly changed as to exceed the followable range set by the phase locked loop.

FIG. 1 is a block diagram showing the principle according to the present invention.

FIG. 3 is a timing chart showing waveforms at each of the portions.

Figure 2:
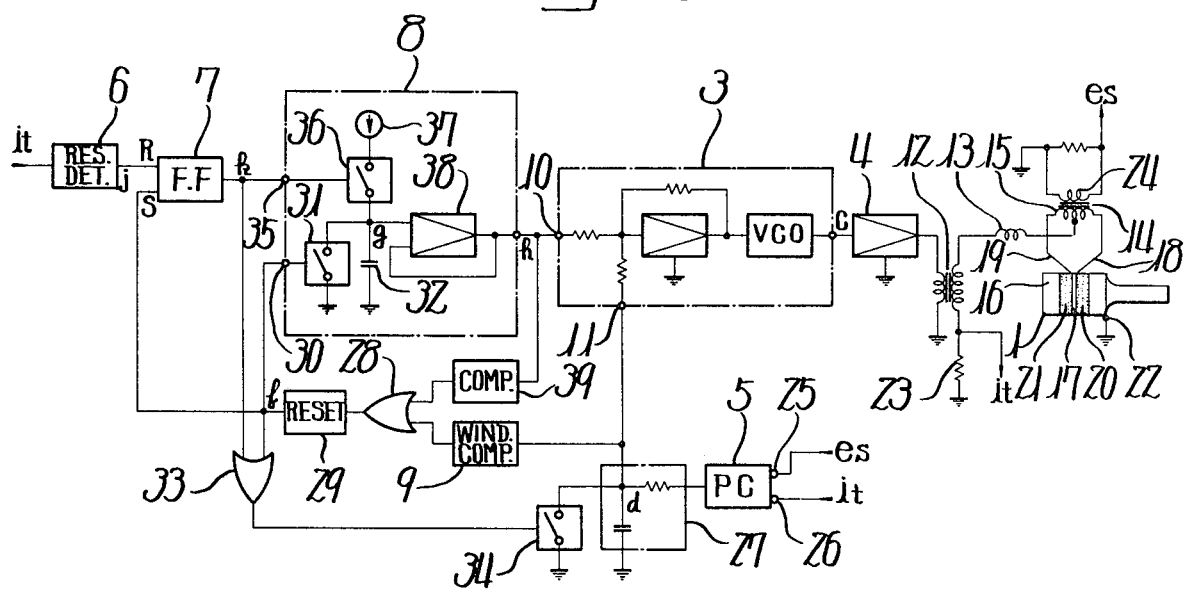
FIG. 2 is a circuit diagram showing a preferred embodiment according to the present invention.

The invention is described below in conjunction with the accompanying drawings. Referring first to FIG. 1, an ultrasonic transducer 1 is connected to a PLL follower, i.e., to a phase locked loop 2. The phase locked loop 2 consists of a voltage controlled oscillator 3, an amplifier 4 and a phase comparator 5, which are connected in the form of a loop. To the amplifier 4 has been connected the ultrasonic transducer 1 which feeds vibratory velocity signals a to the phase comparator 5. To the amplifier 4 is connected a resonant point detector 6 which is connected to a reset terminal R of a flip-flop 7. A sweep circuit 8 is connected between the output side of the flip-flop 7 and the voltage controlled oscillator 3. Further, a window comparator 9 is connected between the phase comparator 5 and a set terminal S of the flip-flop 7.

When the oscillation is started, the output voltage of the sweep circuit 8 is first reset to zero and, then, the sweeping is started. During the period of sweeping, the output voltage b of the phase comparator 5 is held at a center value in the PLL followable range. The output of the sweep circuit 8 is fed as another control input to the voltage controlled oscillator 3 so that its oscillating frequency is swept over a frequency range wider than the PLL followable range. Hence, the ultrasonic transducer 1 is driven by a driving voltage or a driving current which is swept from a low frequency toward a high frequency. Then, the resonant point of the ultrasonic transducer 1 is detected by the resonant point detector 6 which produces an output to reset the flip-flop 7, whereby the sweeping function of the sweep circuit 8 is halted. Therefore, the oscillating frequency of the voltage controlled oscillator 3 is locked to a resonant point of the ultrasonic transducer 1.

Then, the output voltage b of the phase comparator 5 is allowed to change from the center value of the PLL followable range, the frequency control of the voltage controlled oscillator 3 is handled by the phase comparator 5 and the PLL operation begins. Accordingly, even when the resonant frequency of the ultrasonic transducer 1 varies due to some causes, the ultrasonic transducer 1 operates properly if the varied resonant frequency lies within the followable range set by the phase locked loop 2.

In this case, the window comparator 9 is always detecting the resonant frequency. Here, if the quantity of change exceeds the followable range of the phase locked loop 2, the window comparator 9 produces an output to set the flip-flop 7, whereby the sweep circuit 8 is started again to lock the oscillating frequency to a new resonant frequency; the function is then shifted to the PLL operation as mentioned above.

The undesirable subresonant frequencies of the ultrasonic transducer 1 are usually located at points higher than the fundamental resonant frequency. It is therefore desirable to start the oscillation of the sweep circuit 8 from the lower frequency as mentioned above, so that the oscillating frequency is not locked to such undesired frequencies. Further, the ultrasonic transducer 1 may be made up of either an electro-strictive transducer or a magneto-strictive transducer, and its operation mode may be based upon either a parallel resonant point or a series resonant point. When the ultrasonic transducer is operated based upon the series resonant point, however, it is recommended that an impedance inverter for converting a constant voltage supply to a constant current supply be inserted between the output of the amplifier 4 and the ultrasonic transducer 1.

A circuit setup embodying the abovementioned principle and its operation in conjunction with FIG. 2 are discussed below. The portions referred to FIG. 1 are denoted by the same reference numerals in FIG. 2. First, the voltage controlled oscillator 3 has two input terminals, i.e., a ramp voltage input terminal 10 and a phase comparator voltage input terminal 11. The former terminal receives signals for sweeping oscillation, and the latter terminal receives signals for the PLL operation. These signals control the oscillating frequency independent of each other. The output c of the voltage controlled oscillator 3 is amplified by the amplifier 4, and is applied to a primary coil of the output transformer 12. An output voltage produced on a secondary coil of the output transformer 12 flows through a series matching inductance 13, differentially flows through a primary coil 15 of a differential transformer 14 for detecting the vibratory velocity, and flows into electro-strictive elements 20, 21 from positive terminals 18, 19 which are insulated by an insulator 17 of an electro-strictive transducer 16 that serves as the ultrasonic transducer 1. The electric current further flows from a negative terminal 22 into a resistor 23 for detecting the current of the transducer, and returns to the secondary coil of the output transformer 12.

The output voltage produced in the secondary coil 24 of the differential transformer 14, i.e., a vibratory velocity signal $l_s$ is fed as an input signal to an input terminal 25 of the phase comparator 5, and a detected signal $i_t$ for current through transducer produced by the detector resistor 23 is fed as an input signal to an input terminal 26 of the phase comparator 5, whereby the phases of these inputs are compared. A phase compared signal d integrated by a low-pass filter 27 is fed as a PLL control signal to an input terminal 11 of the voltage controlled oscillator 3.

The varying voltage difference of the phase compared signal d, on the other hand, is monitored by the window comparator 9. If the varying difference exceeds a predetermined value, the output signal passes through an OR circuit 28 to trigger a reset circuit 29 so that a reset pulse f is produced in the line. Here, the setpoint value of the window comparator 9 determines the frequency range that is to be locked during the PLL operation. Further, the above reset circuit 29 has a power-on-reset function to reliably produce a reset pulse f when the power supply is turned on.

When the reset circuit 29 is triggered by the turn on of the power supply or by the trigger signal from the window comparator 9, the reset pulse f is fed to a ramp voltage generator circuit, i.e., the reset pulse f is fed to a reset terminal 30 of the sweep circuit 8, whereby an analog switch 31 is turned on, the electric charge stored in an integrating capacitor 32 is discharged to zero, and the phase compared signal d is reset to zero by the analog switch 34 through an OR circuit 33.

Then, flip-flop 7 is triggered and set by a falling edge of the reset pulse f, the analog switch 31 is rendered off by the extinction of the reset pulse f, part of the output voltage k of the flip-flop 7 is fed to a set terminal 35 of the sweep circuit 8, and an analog switch 36 is turned on so that the electric charge is stored in the integrating capacitor 32 which is connected to a constant current circuit 37. At the same time, another part of the output voltage of the flip-flop 7 flows through the OR circuit 33 to maintain the analog switch 34 in an on state, so that the phase compared signal d is cramped to zero.

A charging voltage g of the integrating capacitor 32 is received through a high impedance of the amplifier 38 and is converted into a sweep control signal h for the voltage controlled oscillator 3 in the form of a low-impedance output having equal voltage. Part of the sweep control signal h is fed into the comparator 39. If the sweep control signal h reaches a predetermined value, the comparator 39 works to trigger the reset circuit 29 via the OR circuit 28, so that the sweeping operation is repeated again starting from the reference voltage. This operation determines a maximum value of the sweep control signal h, i.e., determines a maximum varying difference in the sweeping frequencies.

As a result of the above sweeping, the electro-strictive transducer 16 is swept starting from a low frequency. The transducer current, however, becomes minimal at a parallel resonant frequency. Therefore, if a minimum value of a detected current signal $i_t$ through transducer is detected by the resonant point detector 6, the flip-flop 7 is reset by the output j, whereby the charging of the integrating capacitor 32 is terminated by the turn off of the analog switch 36. The integrating capacitor 32 maintains the charging voltage g of that state. Accordingly, the oscillating frequency of the voltage controlled oscillator 3 being swept is locked to a frequency corresponding to a value of the control terminal 10, whereby the analog signal switch 34 is rendered off, and the phase comparator 5 produces the phase compared signal d which serves as the PLL control signal for the voltage controlled oscillator 3 thereby to follow the resonant frequency of the electro-strictive transducer 16.

During the PLL following operation, the resonant frequency of the electro-strictive transducer 16 may often vary greatly due to a worn-out tool or due to any other causes making it difficult to perform the PLL following operation. In such a case, however, the output of the phase comparator 5 is greatly changed, causing the window comparator 9 to be operated, the reset circuit 29 to be reset, and the sweeping function to be continued until the oscillating frequency is locked to a new resonant frequency. Hence, the PLL following operation is initiated again starting from a new resonant point.

The operation of each of the circuits with respect to time is shown in the timing chart of FIG. 3. First, referring to FIG. 3, the abscissa is divided into three sections A, B and C. Section A shows the state in which the phase locked loop 2 is not locked, or shows the state of the sweep circuit 8 and the timing related thereto. Section B shows the state in which the phase locked loop 2 is not locked during the sweeping operation, and section C shows the state in which the resonant point is varied during the following operation.

With reference to the section A, if the power supply is turned on at a point $T_0$, the reset circuit 29 having a power-on-reset function produces the reset pulse f having a pulse width up to a point $T_1$. Hence, the analog switch 31 is turned on to discharge the integrating capacitor 32, and the flip-flop 7 is set to turn on the analog switch 36. The analog switch 28 is also turned on. Thereafter, the analog switch 31 is turned off at the falling edge of the reset pulse f at the point $T_1$, and the electric charge is stored again in the integrating capacitor 32 so that the voltage of the sweep control signal h is gradually increased. As the sweep control signal h rises, the frequency of output c from the voltage controlled oscillator 3 is changed causing the detected current signal $i_t$ through the transducer to be varied. Thus, as the sweep control signal h rises to point $T_2$, the comparator 39 produces an output to reset again the reset circuit 29. This causes the analog switch 31 to be turned on and the integrating capacitor 32 to be discharged.

In reference to section B, the operations at each of the portions at a point $T_3$ are the same as those which took place at the point $T_1$. Here, however, as the sweep control signal h rises up to a point $T_4$, the detected current signal $i_t$ through the transducer establishes a state which develops a resonant point, whereby the resonant point detector 6 produces an output j to reset the flip-flop 7. This causes the analog switch 36 to be turned off, and the integrating capacitor 32 maintains the potential of that state. At the same time, the analog switch 34 is turned off, and the phase compared signal d acquires a value corresponding to the phsae difference between the vibratory velocity signal $l_s$ and the detected current signal $i_t$ through the transducer to perform the PLL following operation. Symbol $T_5$ denotes that the following operation is being carried out.

In reference to section C, when the resonant point has exceeded the followable range of the phase locked loop 2 due to a worn-out tool or for any other reasons during the PLL following operation as mentioned earlier, the phase compared signal d is produced as designated at a point $T_6$. The phase compared signal d is detected by the window comparator 9 at the point $T_6$ to reset again the reset circuit 29. Hence, the reset pulse f is produced having a width of from $T_6$ to $T_7$. At the point $T_7$, the same operation as that which took place at $T_1$ or $T_3$ is performed, and the oscillating frequency is locked to a new resonant point at a point $T_8$. Consequently, the PLL following operation is performed with a new resonant frequency.

The aforementioned embodiment has dealt with the case in which the resonant point detector 6 detected a point at which the transducer current driven at a parallel resonant frequency was minimum. The apparatus, however, may be so constructed that the resonant point detector 6 detects a point at which the transducer current becomes maximum. Namely, since the PLL operation follows the resonant point after the oscillating frequency has been swept and locked by the resonant point detector 6, the resonant point detector 6 needs not be designed to have a high precision but may be simply constructed.

We claim:

1. A method of driving an ultrasonic transducer comprisng the steps of:
   sweeping the frequency of an oscillating signal over a first frequency range;
   driving an ultrasonic transducer by applying said oscillating signal to said ultrasonic transducer;
   detecting the resonant point of said ultrasonic transducer during said sweeping;
   stopping the sweeping upon detection of a resonant point; and
   driving said ultrasonic transducer using a phase locked loop, where the loop includes a phase comparator for comparing the oscillating signal with an output signal from the transducer and an oscillator responsive to the phase comparator for producing said oscillating signal.

2. A method of driving an ultrasonic transducer according to claim 1, wherein the frequency is swept from a low frequency to a higher frequency.

3. A circuit for driving an ultrasonic transducer comprising:
   ultrasonic transducer means for producing ultrasonic waves and a phase signal;
   amplifier means for driving the ultrasonic means;
   phase comparator means for comparing the output of said amplifier means with said phase signal and producing a phase difference signal;
   voltage controlled oscillator means receiving the phase difference signal and producing an output for driving the amplifier means and ultrasonic transducer means;
   a phase locked loop including said voltage controlled oscillator means, said amplifier means and said phase comparator means capable of following a first frequency range;
   sweep circuit means for sweeping an oscillating frequency and driving said voltage controlled oscillator means, being connected to said voltage controlled oscillator means and being capable of stopping the operation of said phase locked loop and sweeping said oscillating frequency over a second frequency range wider than said first frequency range; and
   a resonant point detector being connected to the output of said amplifier means and being capable of detecting the current through said ultrasonic transducer and locking said sweep circuit means at a resonant point of said ultrasonic transducer means so as to render said phase locked loop operative.

4. A circuit for driving an ultrasonic transducer comprising:
   ultrasonic transducer means for producing ultrasonic waves and a phase signal;
   amplifier means for driving the ultrasonic means;
   phase comparator means for comparing the output of said amplifier means with said phase signal and producing a phase difference signal;
   voltage controlled oscillator means receiving the phase difference signal and producing an output for driving the amplifier means and ultrasonic transducer means;
   a phase locked loop including said voltage controlled oscillator means, said amplifier means and said phase comparator means capable of following a first frequency range;
   sweep circuit means for sweeping an oscillating frequency and driving said voltage controlled oscillator means, being connected to said voltage controlled oscillator means and being capable of stopping the operation of said phase locked loop and sweeping said oscillating frequency over a second frequency range wider than said first frequency range;

a resonant point detector being connected to the output of said amplifier means and being capable of detecting the current through said ultrasonic transducer and locking said sweep circuit means at a resonant point of said ultrasonic transducer means so as to render said phase locked loop operative; and a window comparator connected between said phase comparator means and said sweep circuit means, said window comparator being capable of detecting the phase difference signal in said phase locked loop to drive the sweep circuit means when the phase difference signal exceeds the range set by the phase locked loop and thereby lock the oscillating frequency to a new resonant point.

5. A circuit for driving an ultrasonic transducer comprising:

ultrasonic transducer means for producing ultrasonic waves and a phase signal;

amplifier means for driving the ultrasonic means;

phase comparator means for comparing the output of said amplifier means with said phase signal and producing a phase difference signal;

voltage controlled oscillator means receiving the phase difference signal and producing an output for driving the amplifier means and ultrasonic transducer means;

a phase locked loop including said voltage controlled oscillator means, said amplifier means and said phase comparator means capable of following a first frequency range;

sweep circuit means for sweeping an oscillating frequency and driving said voltage controlled oscillator means, being connected to said voltage controlled oscillator means and being capable of stopping the operation of said phase locked loop and sweeping said oscillating frequency over a second frequency range wider than said first frequency range;

a resonant point detector being connected to the output of said amplifier means and being capable of detecting the current through said ultrasonic transducer and locking said sweep circuit means at a resonant point of said ultrasonic transducer means so as to render said phase locked loop operative; and a comparator connected between an input terminal and output terminal of said sweep circuit means, said comparator detecting the condition of the sweep circuit means to reset said sweep circuit means when the said oscillating frequency of said sweep circuit means has reached a predetermined value, so that sweeping is effected again from a reference frequency.

* * * * *